United States Patent
Liu et al.

(10) Patent No.: US 9,787,305 B2
(45) Date of Patent: *Oct. 10, 2017

(54) APPARATUS AND METHODS FOR PIN DIODE SWITCHES FOR RADIO FREQUENCY ELECTRONIC SYSTEMS

(71) Applicant: SKYWORKS SOLUTIONS, INC., Woburn, MA (US)

(72) Inventors: Wei Liu, Irvine, CA (US); Bipul Agarwal, Irvine, CA (US); Richard Mark Puente, Westminster, MA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/377,820

(22) Filed: Dec. 13, 2016

(65) Prior Publication Data

US 2017/0093396 A1  Mar. 30, 2017

Related U.S. Application Data

(63) Continuation of application No. 15/049,684, filed on Feb. 22, 2016, now Pat. No. 9,564,892.

(Continued)

(51) Int. Cl.
*H04W 88/08* (2009.01)
*H03K 17/74* (2006.01)
(Continued)

(52) U.S. Cl.
CPC .............. *H03K 17/74* (2013.01); *G05F 3/08* (2013.01); *H01L 23/3731* (2013.01); *H01L 23/49503* (2013.01); *H01L 23/49562* (2013.01); *H01L 23/49568* (2013.01); *H01L 23/49575* (2013.01); *H01L 23/49589* (2013.01); *H01L 23/66* (2013.01); *H01L 25/16* (2013.01);
(Continued)

(58) Field of Classification Search
CPC ....... H04W 88/08; H04B 1/109; H04B 1/525; H04B 1/406; H04B 1/401; H03K 17/74; H03K 17/76; H03K 17/667; H01L 29/868; H01L 23/49562; H01L 23/49506; H01L 23/66; H01L 27/24; H01L 2223/6677

See application file for complete search history.

(56) References Cited

U.S. PATENT DOCUMENTS 4,486,722 A   12/1984  Landt
4,883,984 A   11/1989  Kess (Continued)

*Primary Examiner* — Thanh Le
(74) *Attorney, Agent, or Firm* — Knobbe Martens Olson & Bear LLP

(57) ABSTRACT

Apparatus and methods for PIN diode switches for radio frequency electronic systems are provided herein. In certain configurations, a packaged switch including a packaging substrate including a die paddle and a thermally conductive substrate attached to the die paddle, one or more PIN diode switches attached to the thermally conductive substrate, and a driver chip attached to the die paddle and configured to generate a plurality of bias voltages operable to control biasing of the one or more PIN diode switches. The driver chip includes a switching regulator configured to generate a first bias voltage of the plurality of bias voltages and a charge pump configured to generate a second bias voltage of the plurality of bias voltages.

20 Claims, 7 Drawing Sheets

Related U.S. Application Data

(60) Provisional application No. 62/129,633, filed on Mar. 6, 2015, provisional application No. 62/163,202, filed on May 18, 2015.

(51) Int. Cl.

| | | |
|---|---|---|
| *G05F 3/08* | (2006.01) | |
| *H01L 25/16* | (2006.01) | |
| *H01L 23/495* | (2006.01) | |
| *H01L 23/373* | (2006.01) | |
| *H01L 29/868* | (2006.01) | |
| *H01L 23/66* | (2006.01) | |
| *H02M 3/07* | (2006.01) | |
| *H01L 23/00* | (2006.01) | |

(52) U.S. Cl.
CPC ............ *H01L 29/868* (2013.01); *H02M 3/07* (2013.01); *H01L 24/48* (2013.01); *H01L 2223/6677* (2013.01); *H01L 2224/48091* (2013.01); *H01L 2224/48106* (2013.01); *H01L 2224/48247* (2013.01); *H01L 2224/48257* (2013.01); *H01L 2924/12031* (2013.01); *H01L 2924/1426* (2013.01); *H01L 2924/3011* (2013.01); *H04W 88/08* (2013.01)

(56) References Cited

U.S. PATENT DOCUMENTS

| | | |
|---|---|---|
| 5,144,157 A | 9/1992 | Russell et al. |
| 6,229,412 B1 | 5/2001 | Delzer |
| 6,459,885 B1 | 10/2002 | Burgess |
| 7,639,106 B2 | 12/2009 | Shtrom |
| 7,755,173 B2 | 7/2010 | Mondi et al. |
| 9,564,892 B2 | 2/2017 | Liu et al. |
| 2007/0274238 A1 | 11/2007 | Kim |
| 2010/0069014 A1* | 3/2010 | Haartsen ................ H04B 1/109 455/67.11 |
| 2010/0208517 A1* | 8/2010 | Lo .......................... H01L 27/24 365/175 |
| 2013/0028147 A1* | 1/2013 | Black .................... H04B 1/109 370/277 |
| 2013/0049818 A1 | 2/2013 | Liu et al. |

\* cited by examiner

APPARATUS AND METHODS FOR PIN DIODE SWITCHES FOR RADIO FREQUENCY ELECTRONIC SYSTEMS

CROSS-REFERENCE TO RELATED APPLICATIONS

This application is a continuation of U.S. application Ser. No. 15/049,684, filed Feb. 22, 2016, and titled "APPARATUS AND METHODS FOR RADIO FREQUENCY PIN DIODE SWITCHES," which claims the benefit of priority under 35 U.S.C. §119(e) of U.S. Provisional Patent Application No. 62/163,202, filed May 18, 2015 and titled "APPARATUS AND METHODS FOR RADIO FREQUENCY PIN DIODE SWITCHES," and of U.S. Provisional Patent Application No. 62/129,633, filed Mar. 6, 2015 and titled "APPARATUS AND METHODS FOR PIN DIODE SWITCHES," each of which are herein incorporated by reference in their entireties.

BACKGROUND

Field

Embodiments of the invention relate to electronic systems, and in particular, to radio frequency (RF) electronics.

Description of the Related Technology

A PIN diode can include a heavily doped p-type semiconductor region, a heavily doped n-type semiconductor region, and an intrinsic semiconductor region positioned between the heavily doped p-type and n-type semiconductor regions. PIN diodes can be used in radio frequency (RF) applications as RF switches. For example, an RF switch implemented using PIN diodes can exhibit high isolation, low insertion loss, and/or high power handling capabilities. PIN diodes can be suitable to operate as a transmit/receive switch in a base station, since the PIN diodes can handle high power RF signals associated with base station transmit and receive operations.

A driver circuit can provide bias voltages and/or currents used to control a resistance value of a PIN diode. The driver circuit can bias the PIN diode to turn on or off the PIN diode to operate the PIN diode as an RF switch. The driver circuit can operate using voltages of a variety of levels to provide fine-tuned control over the PIN diode's resistance, thereby controlling ON and OFF state impedances of the PIN diode. This in turn, can aid in providing low insertion loss in the ON state and high isolation in the OFF state.

SUMMARY

In certain embodiments, the present disclosure relates to a packaged switch. The packaged switch includes a plurality of pins including a power supply pin, an antenna pin, a receive pin, and a transmit pin. The packaged switch further includes a plurality of PIN diode switches including a first PIN diode switch electrically connected between the antenna pin and the transmit pin, and a second PIN diode switch electrically connected between the antenna pin and the receive pin. The packaged switch further includes a driver chip including one or more voltage regulators integrated thereon and powered by a power supply voltage received from the power supply pin. The driver chip is configured to generate a plurality of bias voltages operable to control biasing of the plurality of PIN diode switches.

In some embodiments, the power supply pin is the only power supply pin of the packaged switch.

In various embodiments the one or more voltage regulators includes a switching regulator configured to generate a regulated voltage that is greater than the power supply voltage. According to certain embodiments, the plurality of pins includes a ground pin configured to receive a ground voltage, and the one or more voltage regulators include a negative charge pump configured to generate a charge pump voltage that is less than the ground voltage. In a number of embodiments, the plurality of pins includes a switch control pin configured to receive a switch control signal, and the driver chip is configured to control the plurality of bias voltages based on a state of the switch control signal.

In some embodiments, the driver chip is configured to bias the first PIN diode switch with a first bias voltage of the plurality of bias voltages and to bias the second PIN diode switch with a second bias voltage of the plurality of bias voltages, and the driver chip further includes a selection logic circuit that generates the first bias voltage using the charge pump voltage and the second bias voltage using the regulated voltage when the switch control signal is in a first state, and that generates the first bias voltage using the regulated voltage and the second bias voltage using the charge pump voltage when the switch control signal is in a second state.

In accordance with a number of embodiments, the plurality of pins includes a program pin configured to receive a programming signal, and the driver chip is configured to control a voltage level of at least one of the regulated voltage or the charge pump voltage based on the programming signal.

In various embodiments, the packaged switch further includes a die paddle, and the driver chip is attached to the die paddle. According to some embodiments, the packaged switch further includes an aluminum nitride (AlN) substrate attached to the die paddle, and the plurality of PIN diode switches are attached to the AlN substrate.

In several embodiments, the packaged switch further includes a chip capacitor, and the plurality of PIN diode switches further include a third PIN diode switch electrically connected between the receive pin and a first end of the chip capacitor. In some embodiments, the plurality of pins further includes a ground pin, and a second end of the chip capacitor is electrically connected to the ground pin. According to various embodiments, the plurality of PIN diode switches further includes a fourth PIN diode switch electrically connected in parallel with the first PIN diode switch between the antenna pin and the transmit pin.

In certain embodiments, the present disclosure relates to a method of radio frequency switching. The method includes receiving a power supply voltage on a supply voltage pin of a packaged switch that includes a driver chip and a plurality of PIN diode switches. The method further includes powering one or more voltage regulators that are integrated on the driver chip using the power supply voltage and generating a plurality of bias voltages using the driver chip. The method further includes controlling biasing of the plurality of PIN diode switches using the plurality of bias voltages, including controlling biasing of a first PIN diode switch that is electrically connected between an antenna pin and a receive pin of the packaged switch, and controlling biasing of a second PIN diode switch that is electrically connected between the antenna pin and a transmit pin of the packaged switch.

In certain embodiments, the present disclosure relates to a base station. The base station includes a printed circuit board and a packaged switch attached to the printed circuit board. The packaged switch includes a power supply pin, an antenna pin, a receive pin, a transmit pin, a first PIN diode switch electrically connected between the antenna pin and the transmit pin, a second PIN diode switch electrically connected between the antenna pin and the receive pin, and a driver chip including one or more voltage regulators integrated thereon. The one or more voltage regulators are powered by a power supply voltage received from the power supply pin, and the driver chip is configured to generate a plurality of bias voltages operable to control biasing of the first PIN diode switch and the second PIN diode switch.

In a number of embodiments, the packaged switch is implemented in a quad-flat no-lead (QFN) package.

In some embodiments, the packaged switch further includes a receive bias driver output pin that outputs the first bias voltage, and the base station further includes a first biasing inductor and a first filter on the printed circuit board and electrically connected between the receive bias driver output pin and the receive pin. In various embodiments, the packaged switch further includes a transmit bias driver output pin that outputs the second bias voltage, and the base station further includes a second biasing inductor and a second filter on the printed circuit board and electrically connected between the transmit bias driver output pin and the transmit pin.

According to several embodiments, the power supply pin is the only power supply pin of the packaged switch.

In a number of embodiments, the packaged switch further includes a switching regulator output voltage pin, and the one or more voltage regulators includes a switching regulator configured to output a switching regulator output voltage on the switching regulator output voltage pin. In various embodiments, the packaged switch further includes a rectified voltage pin, and the base station further includes a rectification circuit on the printed circuit board and configured to generate a rectified voltage based on rectifying the switching regulator output voltage and to provide the rectified voltage to the rectified voltage pin.

In certain embodiment, the present disclosure relates to a packaged switch. The packaged switch includes a die paddle, one or more PIN diode switches attached to the die paddle, and a driver chip adjacent to the die paddle. The driver chip includes one or more voltage regulators configured to control biasing of the one or more PIN diode switches.

In some embodiments, the packaged switch further includes an antenna pin, a receive pin, and a transmit pin. The one or more PIN diode switches include a first PIN diode switch electrically connected between the antenna pin and the transmit pin and a second PIN diode switch electrically connected between the antenna pin and the receive pin.

In various embodiments, the packaged switch further includes a chip capacitor attached to the die paddle, and the one or more PIN diode switches further include a third PIN diode switch electrically connected between the receive pin and the chip capacitor.

In a number of embodiments, the one or more PIN diode switches further include a fourth PIN diode switch electrically connected in parallel with the first PIN diode switch between the antenna pin and the transmit pin.

According to some embodiments, the packaged switch further includes a supply voltage pin, and the one or more voltage regulators are configured to generate a plurality of bias voltages from a power supply voltage received on the supply voltage pin. In certain embodiments, the supply voltage pin is the only power supply pin of the packaged switch. In some embodiments, the one or more voltage regulators include a switching regulator. In a number of embodiments, the one or more voltage regulators include a charge pump.

In certain embodiments, the present disclosure relates to a base station. The base station includes a printed circuit board and a packaged switch attached to the circuit board. The packaged switch includes one or more PIN diode switches and a driver chip integrated therein. The driver chip includes one or more voltage regulators configured to control biasing of the one or more PIN diode switches.

In various embodiments, the packaged switch is implemented in a quad-flat no-lead (QFN) package.

According to several embodiments, the packaged switch includes a packaging substrate including a die paddle on which the driver chip is attached. In some embodiments, the packaging substrate further includes an aluminum nitride (AlN) substrate attached to the die paddle, and the one or more PIN diode switches are attached to the AlN substrate to enhance thermal performance.

In various embodiments, the packaged switch further includes an antenna pin, a receive pin, and a transmit pin. Additionally, the one or more PIN diode switches include a first PIN diode switch electrically connected between the antenna pin and the transmit pin and a second PIN diode switch electrically connected between the antenna pin and the receive pin.

In a number of embodiments, the packaged switch further includes a chip capacitor, and the one or more PIN diode switches further include a third PIN diode switch electrically connected between the receive pin and the chip capacitor.

In several embodiments, the packaged switch further includes a receive bias driver output pin, and the driver chip is configured to output a first bias voltage on the receive bias driver output pin.

In some embodiments, the base station further includes an inductor on the printed circuit board and electrically connected between the receive bias driver output pin and the receive pin.

According to various embodiments, the packaged switch further includes a transmit bias driver output pin, and the driver chip is configured to output a second bias voltage on the transmit bias driver output pin.

In a number of embodiments, the base station further includes an inductor on the printed circuit board and electrically connected between the transmit bias driver output pin and the transmit pin.

In some embodiments, the packaged switch further includes a supply voltage pin, and the one or more voltage regulators are configured to generate a plurality of bias voltages from a power supply voltage received on the supply voltage pin.

In several embodiments, the supply voltage pin is the only power supply pin of the packaged switch.

According to various embodiments, the packaged switch further includes a switching regulator output voltage pin, and the one or more voltage regulators include a switching regulator configured to output a switching regulator output voltage on the switching regulator output voltage pin.

In a number of embodiments, the base station further includes a power inductor on the printed circuit board and electrically connected between the switching regulator output voltage pin and the supply voltage pin.

In some embodiments, the packaged switch further includes a rectified voltage pin. The base station further includes a rectification circuit on the printed circuit board and configured to generate a rectified voltage based on rectifying the switching regulator output voltage, and the rectification circuit further configured to provide the rectified voltage to the rectified voltage pin.

In various embodiments, the packaged switch further includes a feedback pin, and the base station further includes a resistor divider on the printed circuit board and configured to provide a fraction of the rectified voltage to the feedback pin.

In several embodiments, the packaged switch further includes a frequency compensation pin, and the base station further includes a compensation circuit on the printed circuit board and electrically connected to the frequency compensation pin to provide frequency compensation to the switching regulator.

In certain embodiment, the present disclosure relates to a method of radio frequency switching in a base station. The method includes receiving a power supply voltage on a supply voltage pin of a packaged switch, the packaged switch including one or more PIN diode switches and a driver chip integrated therein. The method further includes generating a plurality of bias voltages from the power supply voltage using one or more voltage regulators of the driver chip. The method further includes biasing the one or more PIN diode switches using the plurality of bias voltages.

DETAILED DESCRIPTION OF EMBODIMENTS

Figure 1:
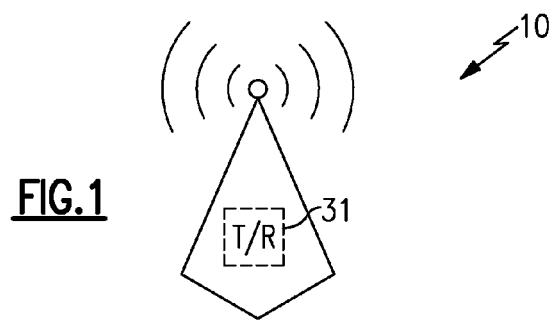
FIG. 1 is a schematic diagram of one example of a base station.

The headings provided herein, if any, are for convenience only and do not necessarily affect the scope or meaning of the claimed invention.

Disclosed herein are apparatus and methods for radio frequency (RF) PIN diode switches. In certain configurations, one or more PIN diode switches are integrated with a driver chip in a common package. The driver chip includes voltage regulators, such as switching regulators and/or charge pumps configured to generate voltage levels used to control biasing of the PIN diode switches. Thus, the packaged switch can operate using a single power supply voltage, which the voltage regulators of the driver chip use to generate biasing voltage levels used for controlling the PIN diode switches.

In certain configurations, a first supply voltage level, such as +5 V, can be used for control and forward bias functions of a PIN diode switch. Additionally, a second supply voltage level, such as a +28 V, can be used to provide high reverse bias voltage to turn off the PIN diode switch and provide high isolation.

A PIN diode switch can be enclosed in a package and controlled using an external driver circuit that is outside of the package. However, using a PIN diode switch and a driver circuit that are not integrated, such as systems built with discrete components, can result in a relatively large overall area and/or higher complexity. In addition, an external driver circuit can operate using an external high voltage supply such as a +28 V supply. The bulky switch drivers and the external high voltage routing can result in the application circuits (for example, a printed circuit board) being prohibitively large and/or complicated. Additionally, the application circuit can operate with limited available bias or supply voltages, which can constrain power consumption and/or performance optimization. Separate circuits built with discrete components can operate using two or more power supply voltages, such as an external high voltage power supply used for controlling the OFF state of the PIN diode and a low voltage power supply used for controlling the ON state of the PIN diode switch.

In certain configurations herein, a packaged switch includes one or more PIN diode switches integrated in a common package with a driver chip that includes one or more voltage regulators. Implementing the packaged switch in this manner provides a fully integrated switch that can operate with a single power supply voltage provided to a pin of the package. For example, multiple voltage regulators, such as buck converter(s), boost converter(s), buck-boost converter(s), positive voltage regulator(s) (for example, a positive charge pump), negative voltage regulator(s) (for example, a negative charge pump), or combinations thereof, can be implemented on a die and integrated in a compact package with one or more high power PIN diode switches to act as a fully integrated multi-throw switch with a single supply voltage input.

The integrated voltage regulator not only can provide a well-controlled forward bias current, but can also generate a high reverse bias voltage for controlling OFF-state performance of the PIN diode switches. Additionally, the integrated voltage regulator can provide control signals to enable operation in different operating modes. The integrated voltage regulator can, for example, use a single supply voltage (for instance, a +5 V supply), and can generate various internal voltages (for instance, a +28 V supply, a +3 V supply, a −5 V supply, etc.).

In certain configurations, a programmable interface, such as a serial peripheral interface (SPI) or a general-purpose input/out (GPIO), can be used to provide programmability. For example, a one or more program pins can be used to control a voltage level of an internal voltage generated by a voltage regulator of a driver chip.

The teachings herein can be used to achieve a wide variety of advantages. For example, power consumption, performance, board area and/or cost can be improved and optimized in accordance with the teachings herein. Additionally, an end-user of the integrated PIN diode switch/driver chip need not have to route multiple voltages to the switch or implement complex discrete and/or inflexible driver circuits.

Thus, integrating a PIN diode switch with a driver chip on a common package in accordance with the teachings herein can greatly reduce application circuit board area and ease the use of the PIN diode switch. The integrated driver chip can provide various control voltages instead of just one or two fixed values. Additionally, the integrated driver chip can operate with reduced power consumption and without requiring multiple input supply voltages. Furthermore, the integrated driver can be controlled through one or more program pins (for example, via an SPI or GPIO) with flexible logic control levels like +1.8 V or +3.3 V, and can be implemented with temperature compensation, precise on-off timing control, and/or power sequencing.

In certain implementations, the packaged switch includes a packaging substrate, and the driver chip and the PIN diode switches are attached to the packaging substrate. The packaging substrate can be implemented in a wide variety of ways, and can include, for example, a laminated substrate, a ceramic substrate, a lead frame, and/or a die paddle. In one embodiment, the packaging substrate includes a die paddle and an aluminum nitride (AlN) substrate attached to the die paddle. Additionally, the one or more PIN diode switches are attached to the AlN substrate and the driver chip is attached to the die paddle, thereby providing robust thermal performance.

FIG. 1 is a schematic diagram of one example of a base station 10. The base station 10 can be used in a wireless network to communicate with mobile devices. The base station 10 includes a transmit/receive (T/R) switch 31, which can be implemented in accordance with teachings of the present disclosure.

The base station 10 of FIG. 1 can represent a variety of types of base stations, such as a cellular base station or tower, a macro-cell base station, or a micro-cell base station. The base station 10 can communicate using a wide variety of communication standards and frequency bands. For example, the base station 10 can transmit and receive radio frequency signals, including, for instance, signals with microwave frequencies.

By way of examples, Global System for Mobile (GSM) communication standard is a mode of digital cellular communication that is utilized in many parts of the world. GSM communications can operate at one or more of four frequency bands: 850 MHz (approximately 824-849 MHz for Tx, 869-894 MHz for Rx), 900 MHz (approximately 880-915 MHz for Tx, 925-960 MHz for Rx), 1800 MHz (approximately 1710-1785 MHz for Tx, 1805-1880 MHz for Rx), and 1900 MHz (approximately 1850-1910 MHz for Tx, 1930-1990 MHz for Rx). Variations and/or regional/national implementations of the GSM bands are also utilized in different parts of the world.

Code division multiple access (CDMA) is another standard that can be implemented in base stations. In certain implementations, CDMA devices can operate in one or more of 800 MHz, 900 MHz, 1800 MHz and 1900 MHz bands, while certain W-CDMA and Long Term Evolution (LTE) devices can operate over 22 or more radio frequency spectrum bands.

The packaged switches of the present disclosure can operate as high power switches in RF electronic systems, such as the base station 10 of FIG. 1. For example, a packaged switch can be used to implement the T/R switch 31. However, the packaged switches disclosed herein can be in used other RF electronic systems.

Figure 2:
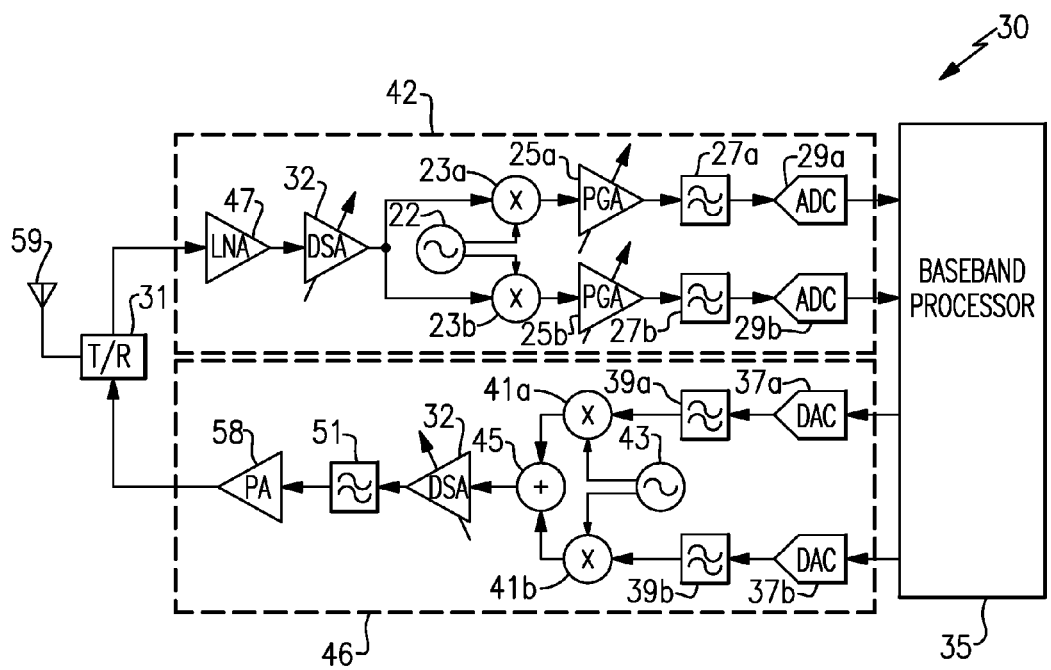
FIG. 2 is a schematic diagram of another example of a base station.

FIG. 2 is a schematic diagram of another example of a base station 30. The base station 30 includes a baseband processor 35, a receive path 42, a transmit path 46, a T/R switch 31, and an antenna 59.

The base station 30 can be used for transmitting and/or receiving RF signals using a variety of communication standards, including, for example, Global System for Mobile Communications (GSM), Code Division Multiple Access (CDMA), wideband CDMA (W-CDMA), Long Term Evolution (LTE), Advanced LTE, 3G (including 3GPP), 4G, Enhanced Data Rates for GSM Evolution (EDGE), wireless local loop (WLL), and/or Worldwide Interoperability for Microwave Access (WiMax), as well as other proprietary and non-proprietary communications standards.

The transmit path 46 and the receive path 42 can be used for transmitting and receiving signals over the antenna 59. Although one implementation of the base station 30 is illustrated in FIG. 2, the base station 30 can be modified in any suitable manner. For example, the base station 30 can be modified to include additional transmit paths, receive paths, and/or antennas. For example, in massive multiple-input and multiple-output (MIMO) configurations, a base station can include one hundred or more antennas. In such configurations, the base station includes several T/R switches.

In the illustrated configuration, the receive path 42 includes a low noise amplifier (LNA) 47, a digital step attenuator (DSA) 32, a local oscillator 22, a first mixer 23a, a second mixer 23b, a first programmable gain amplifier (PGA) 25a, a second PGA 25b, a first filter 27a, a second filter 27b, a first analog-to-digital converter (ADC) 29a, and a second ADC 29b. Although one implementation of a receive path is illustrated in FIG. 2, a receive path can include more or fewer components and/or a different arrangement of components.

An RF signal can be received on the antenna 59 and provided to the receive path 42 using the T/R switch 31. For example, the T/R switch 31 can be controlled to electrically couple the antenna 59 to an input of the LNA 47, thereby providing the received RF signal to the LNA's input. The LNA 47 provides low noise amplification such that the LNA 47 amplifies the received RF signal while adding or introducing a relatively small amount of noise. As shown in FIG. 2, the amplified RF signal generated by the LNA 47 is provided to the DSA 32. In the illustrated embodiment, an amount of attenuation provided by the DSA 32 is digitally-controllable, and can be set to achieve a desired signal power level.

The first and second mixers 23a, 23b receive first and second local oscillator clock signals, respectively, from the local oscillator 22. The first and second local oscillator clock signals can have about the same frequency and a phase difference equal to about a quarter of a period, or about 90°. The first and second mixers 23a, 23b downconvert the output of the DSA 32 using the first and second local oscillator clock signals, respectively, thereby generating first and second demodulated signals. The first and second demodulated signals can have a relative phase difference of about a quarter of a period, or about 90°, and can correspond to an in-phase (I) receive signal and a quadrature-phase (Q) signal, respectively. In certain implementations, one of the first or second oscillator clock signals is generated by phase shifting from the other.

The first and second local oscillator clock signals can have a frequency selected to achieve a desired intermediate frequency and/or baseband frequency for the first and second demodulated signals. For example, multiplying the output of the DSA 32 by a sinusoidal signal from the local oscillator 22 can produce a mixed signal having a frequency content centered about the sum and difference frequencies of the carrier frequency of the DSA output signal and the oscillation frequency of the local oscillator 22.

In the illustrated configuration, the first and second demodulated signals are amplified using the first and second programmable gain amplifiers 25a, 25b, respectively. To aid in reducing output noise, the outputs of the first and second programmable gain amplifiers 25a, 25b can be filtered using the first and second filters 27a, 27b, which can be any suitable filter, including, for example, low pass, band pass, or high pass filters. The outputs of the first and second filters 27a, 27b can be provided to the first and second ADCs 29a, 29b, respectively. The first and second ADCs 29a, 29b can have any suitable resolution. In the illustrated configuration, the outputs of the first and second ADCs 29a, 29b are provided to the baseband processor 35 for processing.

The baseband processor 35 can be implemented in a variety of ways. For instance, the baseband processor 35 can include a digital signal processor, a microprocessor, a programmable core, the like, or any combination thereof. Moreover, in some implementations, two or more baseband processors can be included in the base station 30.

As shown in FIG. 2, the transmit path 46 receives data from the baseband processor 35 and is used to transmit RF signals via the antenna 59. The transmit path 46 and the receive path 42 both operate using the antenna 59, and access to the antenna 59 is controlled using the T/R switch 31. The illustrated transmit path 46 includes first and second digital-to-analog converters (DACs) 37a, 37b, first and second filters 39a, 39b, first and second mixers 41a, 41b, a local oscillator 43, a combiner 45, a DSA 32, an output filter 51, and a power amplifier 58. Although one implementation of a transmit path is illustrated in FIG. 2, a transmit path can include more or fewer components and/or a different arrangement of components.

The baseband processor 35 can output a digital in-phase (I) signal and a digital quadrature-phase (Q) signal, which can be separately processed until they are combined using the combiner 45. The first DAC 37a converts the digital I signal into an analog I signal, and the second DAC 37b converts the digital Q signal into an analog Q signal. The first and second DACs 37a, 37b can have any suitable precision. The analog I signal and the analog Q signal can be filtered using the first and second filters 39a, 39b, respectively. The outputs of the first and second filters 39a, 39b can be upconverted using the first and second mixers 41a, 41b, respectively. For example, the first mixer 41a is used to upconvert the output of the first filter 39a based on an oscillation frequency of the local oscillator 43, and the second mixer 41b is used to upconvert the output of the second filter 39b based on the oscillation frequency of the local oscillator 43.

The combiner 43 combines the outputs of the first and second mixers 41a, 41b to generate a combined RF signal. The combined RF signal is provided to an input of the DSA 32, which is used to control a signal power level of the combined RF signal.

The output of the DSA 32 can be filtered using the output filter 51, which can be, for example, a low pass, band pass, or high pass filter configured to remove noise and/or unwanted frequency components from the signal. The output of the output filter 51 can be amplified by a power amplifier 58. In some implementations, the power amplifier 58 includes a plurality of stages cascaded to achieve a target gain. The power amplifier 58 can provide an amplified RF signal to the antenna 59 through the T/R switch 31.

The packaged switches described herein can be used in the base stations of FIGS. 1 and 2. For example, a packaged switch can be used as T/R switch of a base station. The packaged switches can be used in conjunction with a variety of communication standards. For example, in one embodiment a packaged switch is used for switching operations of TDD signals associated with 3G, 4G, LTE and/or Advanced LTE communications.

Although FIGS. 1 and 2 illustrate two examples of base stations that can include packaged switches implemented in accordance with the teachings herein, the packaged switches can be used in other configurations of RF electronics.

Figure 3:
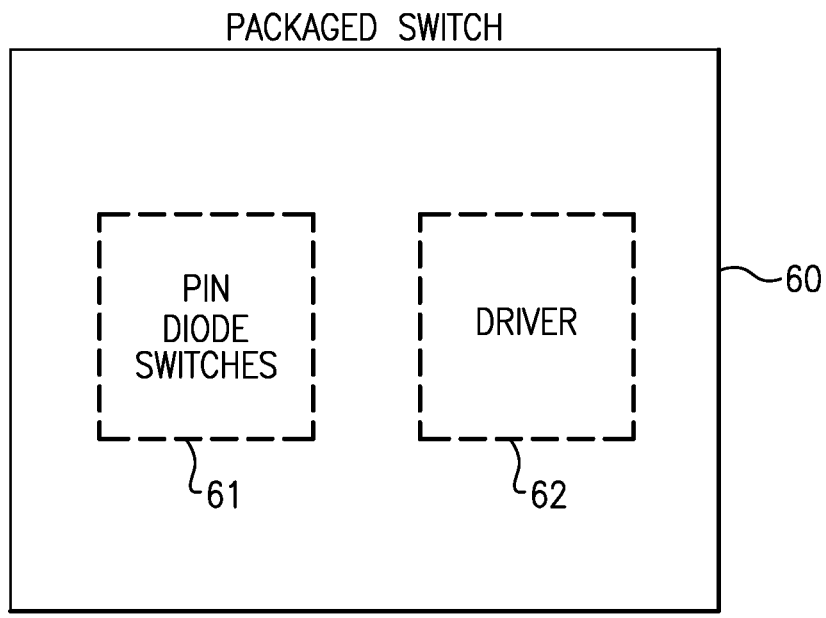
FIG. 3 is a schematic diagram of one embodiment of a packaged switch.

FIG. 3 is a schematic diagram of one embodiment of a packaged switch 60. The packaged switch 60 includes one or more PIN diode switches 61 and a driver chip or integrated circuit (IC) 62.

The driver chip 62 includes one or more voltage regulators, such as switching regulators and/or charge pumps configured to generate voltage levels used to control biasing of the one or more PIN diode switches 61. Thus, the driver chip 62 is used to generate biasing voltage levels for controlling the one or more PIN diode switches 61. Implementing the packaged switch 60 in this manner provides a fully integrated switch that provides a wide variety of advantages relative to an implementation in which a driver circuit is external to a packaged PIN diode switch.

For example, the packaged switch 60 can have lower complexity, cost, size, and/or power consumption relative to a configuration using an external driver circuit. Furthermore, an end-user of the packaged switch 60 need not have to route multiple voltages and/or implement complex discrete and/or inflexible driver circuits.

Thus, integrating the one or more PIN diode switches 61 and the driver chip 62 in the packaged switch 60 can reduce application circuit board area and ease the use of the one or more PIN diode switches 61.

The packaged switch 60 can be implemented using a wide variety of packaging types, including, for example, a quad-flat no-lead (QFN) package or a multi-chip module (MCM).

Additional details of the packaged switch 60 can be as described earlier.

Figure 4:
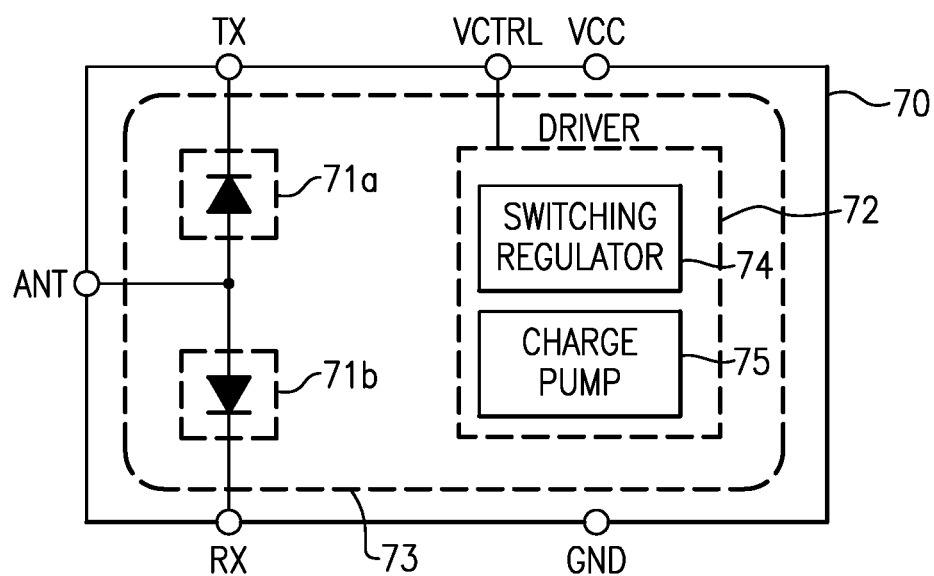
FIG. 4 is a schematic diagram of another embodiment of a packaged switch.

FIG. 4 is a schematic diagram of another embodiment of a packaged switch 70. The packaged switch 70 includes a first PIN diode switch 71a, a second PIN diode switch 71b, a driver chip 72, and a die paddle 73. The driver chip 72 includes a switching regulator 74 and a charge pump 75 in this embodiment. The packaged switch 73 further includes a plurality of package pins, including an antenna pin ANT, a receive pin RX, a transmit pin TX, a switch control pin VCTRL, a ground pin GND, and a supply voltage pin VCC.

The supply voltage pin VCC is used to provide a supply voltage to the driver chip 72. In the illustrated configuration, the packaged switch 70 is powered using a single external supply voltage. For example, in one implementation, the packaged switch 70 operates using a single +5 V DC supply. The ground pin GND is used to provide a ground reference voltage to the die paddle 73 and/or the driver chip 72.

The first and second PIN diode switches 71a, 71b operate as a T/R switch. The first PIN diode switch 71a includes an anode electrically connected to the antenna pin ANT and a cathode electrically connected to the transmit pin TX. Additionally, the second PIN diode switch 71b includes an anode electrically connected to the antenna pin ANT and a cathode electrically connected to the receive pin RX. Additionally, a switch control signal is received on the switch control pin VCTRL, and is used to control a state of the first and second PIN diode switches 71a, 71b. The driver chip's switching regulator 74 and/or charge pump 75 can be used to generate voltage levels used for biasing the first and second PIN diode switches 71a, 71b based on the switch control signal received on the switch control pin VCTRL. For clarity of the figures, details related to the PIN diode biasing are not illustrated in FIG. 4.

When the switch control signal is in a first state, the driver chip 72 can bias the first PIN diode 71a to electrically couple the antenna pin ANT to the transmit pin TX, and can bias the second PIN diode 71b to electrically decouple the antenna pin ANT from the receive pin RX. Additionally, the driver chip 72 can bias the first PIN diode 71a to electrically decouple the antenna pin ANT from the transmit pin TX, and can bias the second PIN diode 71b to electrically couple the antenna pin ANT to the receive pin RX. Thus, a switching operation of the first and second PIN diode switches 71a, 71b can be controlled by the switch control signal received on the switch control pin VCTRL.

As shown in FIG. 4, the first PIN diode 71a, the second PIN diode 71b, and the driver chip 72 are attached to the die paddle 73. The die paddle 73 can aid in providing thermal dissipation, which can increase the power handling capability of the packaged switch 70. Thus, the packaged switch 70 can be suitable for handling high power RF signals, including those associated with base station communications. For instance, in one embodiment the transmit pin TX can handle an RF signal with a peak power of up to about 128 W CW or 631 W peak using LTE-TDD modulation at $T_{case}=25°$ C.

In one embodiment, the switching regulator 74 includes at least one of a buck converter, a boost converter, or a buck-boost converter. In one embodiment, the charge pump 75 includes at least one of a positive charge pump or a negative charge pump.

Figure 5:
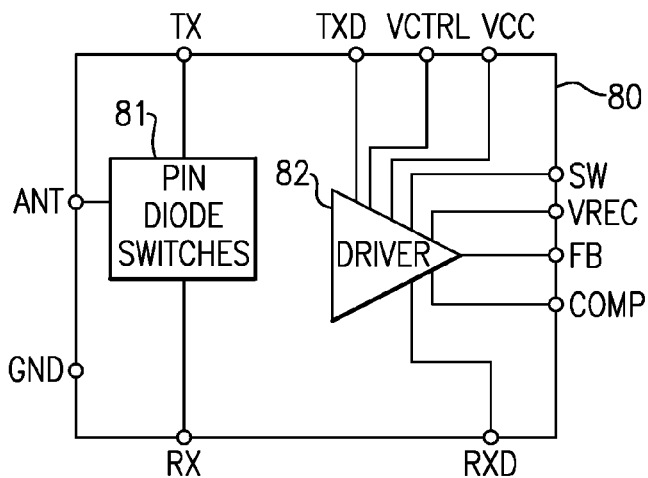
FIG. 5 is a schematic diagram of another embodiment of a packaged switch.

FIG. 5 is a schematic diagram of another embodiment of a packaged switch 80. The packaged switch 80 includes PIN diode switches 81 and a driver chip 82. The packaged switch 80 further includes a plurality of package pins.

As shown in FIG. 5, the package pins include a ground pin GND, a supply voltage pin VCC, an antenna pin ANT, a receive pin RX, a receive bias driver output pin RXD, a transmit pin TX, a transmit bias driver output pin TXD, a switch control pin VCTRL, a switching regulator output voltage pin SW, a rectified voltage pin VREC, a switching regulator feedback pin FB, and a frequency compensation pin COMP. Although FIG. 5 illustrates a certain configuration of pins for the packaged switch 80, the packaged switch 80 can be adapted to include more or fewer pins and/or different pins.

The supply voltage pin VCC is used to provide a supply voltage to the driver chip 82. In the illustrated configuration, the packaged switch 80 is powered using a single external supply voltage. For example, in one implementation, the packaged switch 80 operates using a single +5 V DC supply.

The ground pin GND is used to provide a ground reference voltage to the driver chip 82. In certain configurations, the packaged switch 80 further includes a packaging substrate including a die paddle to which the driver chip 82 is attached, and the ground reference voltage received on the ground pin GND is used to control the voltage level of the die paddle.

In the illustrated configuration, the PIN diode switches 81 are configured to operate as T/R switch. As shown in FIG. 5, the PIN diode switches 81 are electrically coupled to the antenna pin ANT, to the transmit pin TX, and to the receive pin RX. Additionally, a switch control signal is received on the switch control pin VCTRL, and is used to control a state of the PIN diode switches 81. For example, when the switch control signal is in a first state, the PIN diode switches 81 electrically couple the antenna pin ANT to the transmit pin TX and electrically decouple the antenna pin ANT from the receive pin RX. Additionally, when the switch control signal is in a second state, the PIN diode switches 81 electrically couple the antenna pin ANT to the receive pin RX and electrically decouple the antenna pin ANT from the transmit pin TX. Thus, a switching operation of the PIN diode switches 81 can be controlled by the switch control signal received on the switch control pin VCTRL.

In the illustrated configuration, various nodes of the driver circuit 82 are accessed via package pins to allow the operating characteristics and/or performance of the driver circuit 82 to be controlled externally. For example, the packaged switch 80 can be placed on a printed circuit board (PCB) such as a switch board, and components on the PCB can be electrically connected to the receive bias driver output pin RXD, the transmit bias driver output pin TXD, the switching regulator output voltage pin SW, the rectified voltage pin VREC, the switching regulator feedback pin FB, and/or the frequency compensation pin COMP to allow the driver circuit 82 to be externally controlled.

Configuring the packaged switch 80 in this manner can increase flexibility. Additionally, configuring the packaged switch 80 in this matter allows large circuit components such as large inductors and/or capacitors to be placed on a PCB external to the packaged switch 80.

In the illustrated embodiment, the receive bias driver output pin RXD corresponds to an output voltage generated by the driver chip 82 used for controlling a DC bias voltage of the receive pin RX. Additionally, the transmit bias driver output pin TXD corresponds to an output voltage generated by the driver chip 82 used for controlling a DC bias voltage of the transmit pin TX. In certain configurations, the packaged switch 80 is attached to a PCB that includes a first choke inductor and a second choke inductor, and the receive bias driver output pin RXD is electrically connected to the receive pin RX through the first choke inductor and the transmit bias driver output pin TXD is electrically connected to the transmit pin TX through the second choke inductor.

The switching regulator output voltage pin SW corresponds to an output voltage of a switching regulator of the driver chip 82. In the illustrated configuration, the switching regulator's output voltage can be rectified using an external rectification circuit to generate a rectified voltage, which is provided to the packaged switch 80 at the rectified voltage pin VREC. Additionally, external circuit components such as a resistor divider can be used to provide a fraction of the rectified voltage to the switching regulator feedback pin FB. Additionally, the switching regulator feedback pin FB can be electrically connected to external frequency compensation circuitry, such as a resistor-capacitor (RC) circuit, to stabilize the driver chip's switching regulator. The switching regulator output voltage pin SW, the rectified voltage pin VREC, the switching regulator feedback pin FB, and the frequency compensation pin COMP allow the driver circuit's switching regulator to be controlled using external circuit components on a PCB.

Additional details of the packaged switch 80 can be similar to those described earlier.

Figure 6:
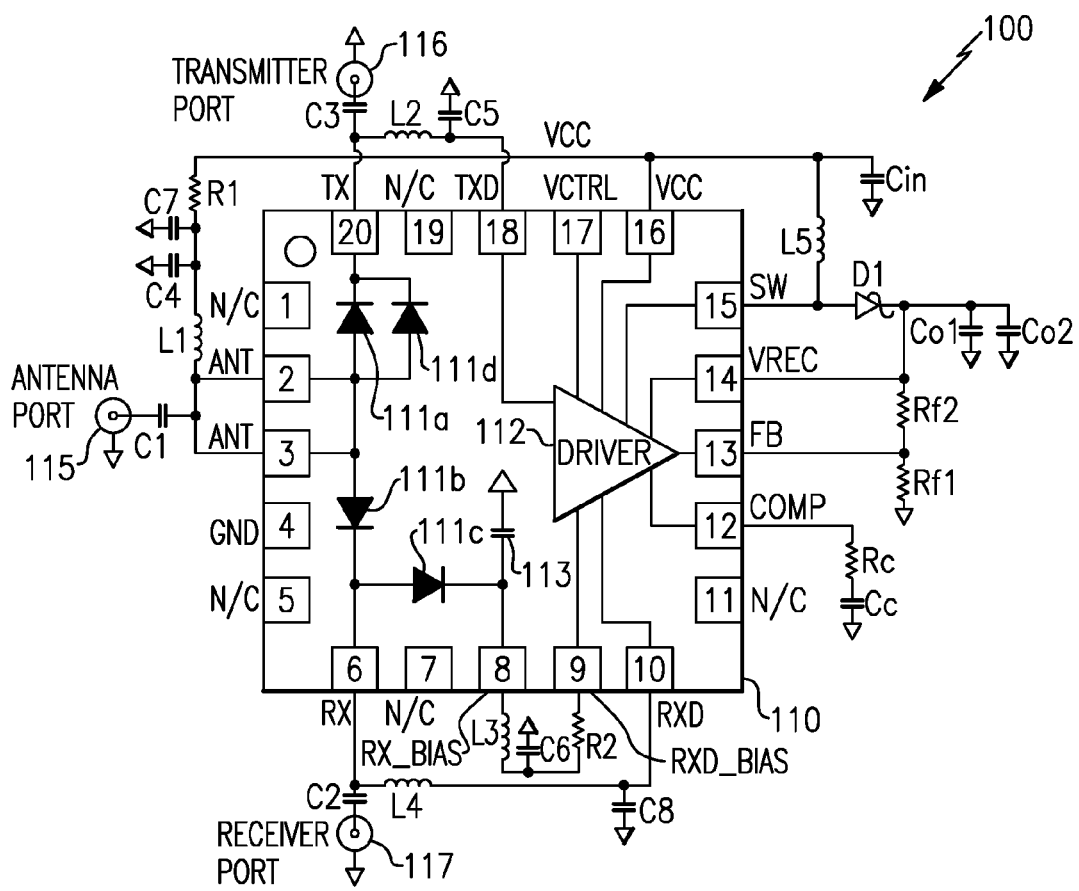
FIG. 6 is a circuit diagram of one embodiment of a switch board including a packaged switch.

FIG. 6 is a circuit diagram of one embodiment of a switch board 100 including a packaged switch 110.

In the illustrated configuration, the packaged switch 110 includes a first PIN diode switch 111a, a second PIN diode switch 111b, a third PIN diode switch 111c, a fourth PIN diode switch 111d, a driver chip 112, and a chip capacitor 113. The packaged switch 110 further includes a plurality of package pins. In the illustrated configuration, the packaged switch 110 includes 20 pins in a QFN package. Certain pins are illustrated as no connect (N/C). However, the packaged switch 110 can be adapted to include more or fewer pins, differential arrangements of pins, and/or can be implemented using other types of packages.

As shown in FIG. 6, two of the package pins are antenna pins ANT. Electrically connecting two or more package pins in parallel can decrease parasitic inductance and/or resistance associated with the pins. The anodes of the first and fourth PIN diode switches 111a, 111d are electrically connected to the antenna pins ANT, and the cathodes of the first and fourth PIN diode switches 111a, 111d are electrically connected to the transmit pin TX. Electrically connecting two or more PIN diode switches in parallel can increase power handling capability, which can be advantageous when a signal power level is high, such as when the pin receives an output of a power amplifier or other high power circuit.

The second PIN diode switch 111b includes an anode electrically connected to the antenna pins ANT and a cathode electrically connected to the receive pin RX and to an anode of the third PIN diode switch 111c. The third PIN diode switch 111c further includes a cathode electrically connected to a first end of the chip capacitor 113 and to the receive shunt bias pin RX_BIAS. In the illustrated configuration, the second PIN diode switch 111b operates as a series switch between the antenna pins ANT and the receive pin RX, and the third PIN diode switch 111c operates in a shunt configuration with respect to the receive pin RX. Implementing the second PIN diode switch 111b and the third PIN diode switch 111c as a series switch and a shunt switch, respectively, can increase RF isolation between the antenna pins ANT and the receive pin RX. For example, when the second PIN diode switch 111b is turned off, the third PIN diode switch 111c can be turned on to provide a low impedance path to RF signal leakage from the antenna pins ANT. The chip capacitor 113, which includes a second end electrically connected to ground, provides an AC ground return for pin diode switch 111c without shorting to ground the DC bias present at the receive shunt bias pin RX_BIAS.

The driver chip 112 is electrically connected to a variety of package pins, including include a supply voltage pin VCC, a receive bias driver output pin RXD, a transmit pin TX, a transmit bias driver output pin TXD, a switch control pin VCTRL, a switching regulator output voltage pin SW, a rectified voltage pin VREC, a switching regulator feedback pin FB, and a frequency compensation pin COMP, which can be as described earlier. The driver chip 112 is also electrically connected to a receive shunt bias driver output pin RXD_BIAS, which the driver chip 112 can control to bias the third or shunt PIN diode switch 111c.

As shown in FIG. 6, the switch board 100 includes various electronic components that are electrically connected to pins of the packaged switch 110. For example, a DC blocking capacitor C1 is electrically connected between an antenna port 115 and the antenna pins ANT. Additionally, a DC blocking capacitor C2 is electrically connected between a receiver port 117 and the receive pin RX, and a DC blocking capacitor C3 is electrically connected between a transmitter port 116 and the transmit pin TX.

Additionally, an inductor L1, a resistor R1, a capacitor C7, and a capacitor C4 are configured to bias the antenna pins ANT with a filtered version of the supply voltage VCC. The capacitor Cin is used as a power supply decoupling capacitor for the supply voltage VCC. Furthermore, the inductor L2 and the capacitor C5 are used for biasing the transmit pin TX with the bias voltage outputted on the transmit bias driver output pin TXD. Additionally, the inductor L4 and the capacitor C8 are used for biasing the receive pin RX with the bias voltage outputted on the receive bias driver output pin RXD. Furthermore, the resistor R2, the capacitor C6, and the inductor L3 are used for biasing the receive shunt bias pin RX_BIAS with the bias voltage outputted on the receive shunt bias driver output pin RXD_BIAS.

The Schottky diode D1 is used for rectifying the output voltage of the driver chip's switching regulator that is provided on the switching regulator output voltage pin SW. Additionally, the inductor L5 is used by the switching regulator as a power inductor. Furthermore, the capacitor Co1 and the capacitor Co2 are used for filtering the rectified voltage. Additionally, the first feedback resistor Rf1 and the second feedback resistor Rf2 are electrically connected in series and operate as a voltage divider that provides a fraction of the rectified voltage to the feedback pin FB. The compensation resistor Rc and the compensation capacitor Cc are used for stabilization of the driver chip's switching regulator in the frequency domain.

The circuit components of the switch board 100 of FIG. 6 illustrate one example of circuit components that can be provided on a PCB to provide control over a packaged switch. However, the example is illustrative, and a wide variety of other configurations of circuit components on a PCB are possible.

In the illustrated configuration, certain circuit components, such as circuit components of a relatively large size, have been placed on the switch board 100. However, the driver chip 113 and the PIN diode switches 111a-111d have been advantageously integrated in a common package. Certain components, such as the chip capacitor 113, have also been integrated in the common package.

Additional details of the switch board 100 can be similar to those described earlier.

Figure 7:
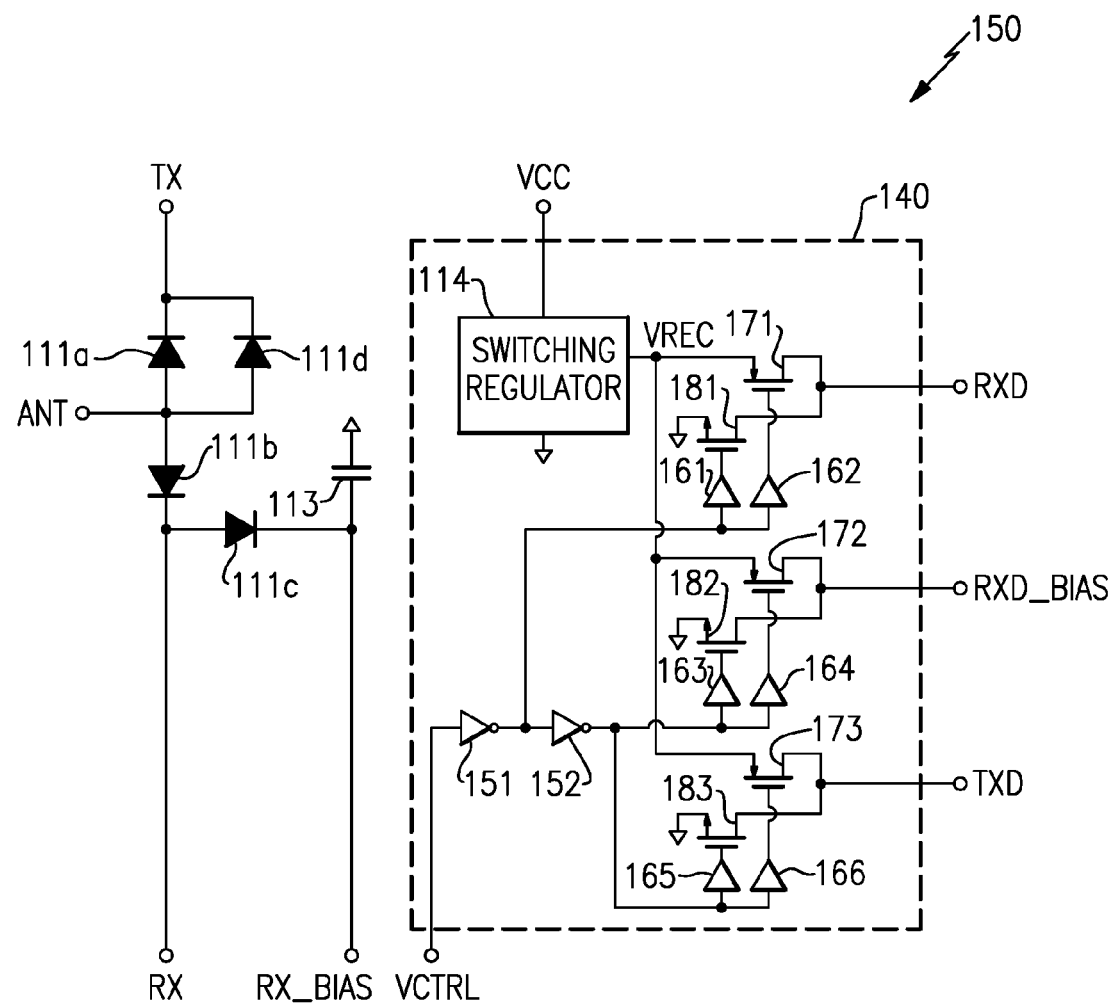
FIG. 7 is a circuit diagram of one embodiment of a packaged switch.

FIG. 7 is a circuit diagram of one embodiment of a packaged switch 150. The packaged switch 150 includes a first PIN diode switch 111a, a second PIN diode switch 111b, a third PIN diode switch 111c, a fourth PIN diode switch 111d, and a chip capacitor 113, which are electrically connected in a manner similar to that described above. The packaged switch 150 further includes a driver chip 140 that includes a switching regulator 114, first and second inverters 151, 152, first to sixth buffers 161-166, first to third p-type field effect transistors (PFETs) 171-173, and first to third n-type field effect transistors (NFETs) 181-183.

The switch regulator 114 is illustrated as providing a rectified voltage VREC, which can be generated in part using external circuitry in a manner similar to that described earlier with respect to FIG. 6. Additionally, first and second inverters 151, 152 and the first to sixth buffers 161-166 operate as a logic circuit that controls the gate voltages of the PFETs 171-173 and the NFETs 181-183 based on a voltage level of the switch control pin VCTRL. The PFETs 171-173 and the NFETs 181-183 are used to selectively control the receive bias driver output pin RXD, the transmit bias driver output pin TXD, and the receive shunt bias driver output pin RXD_BIAS to either a voltage level of the rectified voltage VREC or to a ground voltage based on the state of the voltage level of the switch control pin VCTRL.

Although FIG. 7 illustrates one example of logic circuitry for controlling bias voltage levels generated by a driver chip, bias voltage levels can be generated by a driver chip in a wide variety of ways.

Figure 8:
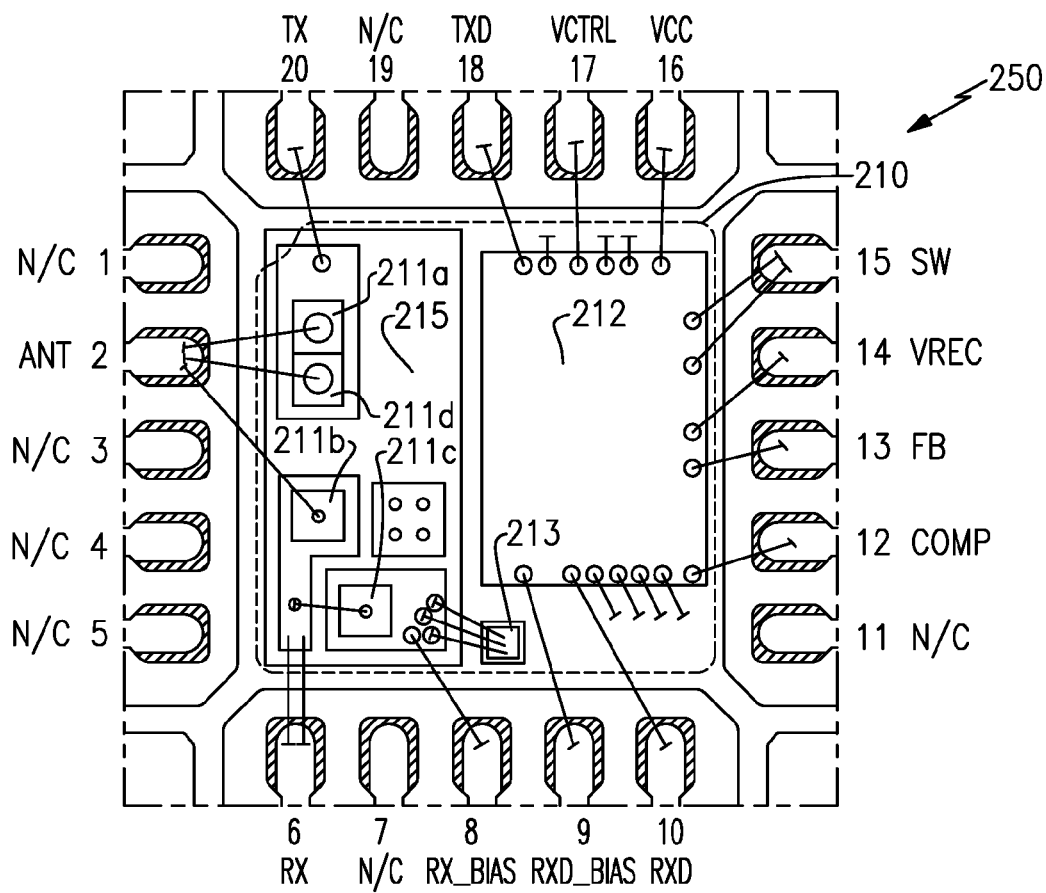
FIG. 8 is a schematic diagram of one embodiment of a quad-flat no-lead (QFN) packaged switch.

FIG. 8 is a schematic diagram of one embodiment of a QFN packaged switch 250. The QFN packaged switch 250 includes a first PIN diode switch 211a, a second PIN diode switch 211b, a third PIN diode switch 211c, a fourth PIN diode switch 211d, a driver chip 212, and a chip capacitor 213. The QFN packaged switch further includes a packaging substrate including a lead frame, a die paddle 210, and an aluminum nitride (AlN) substrate 215. The QFN packaged switch further includes various other structures include package pins, wirebonds, and encapsulation or overmold.

As shown in FIG. 8, the PIN diode switches 211a-211d are attached to the AlN substrate 215, which in turn is attached to the die paddle 210. Configuring the PIN diode switches 211a-211d in this manner can aid in improving thermal performance by facilitating the dissipation of heat.

The PIN diode switches 211a-211d are electrically connected in a configuration similar to that of the PIN diode switches 111a-111d of FIG. 7.

The chip capacitor 213 and the driver chip 212 are attached to die paddle 210. Various bond wires have been illustrated to provide various electrical connections.

In one embodiment, the QFN packaged switch 250 has a length less than or equal to about 5 mm and a width less than or equal to about 5 mm.

Additional details of the QFN packaged switch 250 can be similar to those described earlier.

Figure 9:
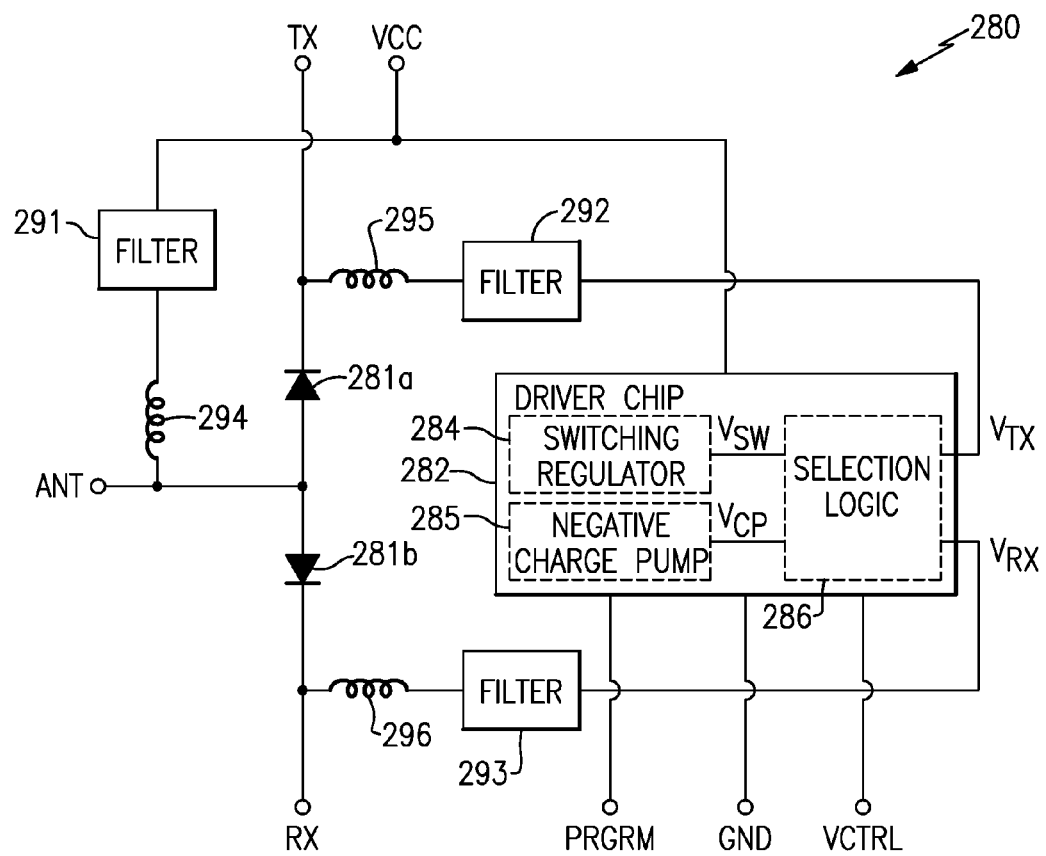
FIG. 9 is a schematic diagram of another embodiment of a packaged switch.

FIG. 9 is a schematic diagram of another embodiment of a packaged switch 280. The packaged switch 280 includes a first PIN diode switch 281a, a second PIN diode switch 281b, a driver chip 282, a first bias voltage filter 291, a second bias voltage filter 292, a third bias voltage filter 293, a first biasing inductor 294, a second biasing inductor 295, and a third biasing inductor 296. The packaged switch 280 further includes an antenna pin ANT, a receive pin RX, a transmit pin TX, a switch control pin VCTRL, a power supply pin VCC, a ground pin GND, and a program pin PGRM.

As shown in FIG. 9, the driver chip 282 includes a switching regulator 284, a negative charge pump 285, and a selection logic circuit 286. The driver chip 282 receives a power supply voltage from the power supply pin VCC, a ground voltage from the ground pin GND, and a switch control signal from the switch control pin VCTRL. The driver chip 282 further receives a programming signal from the program pin PRGRM.

The first and second PIN diode switches 281a, 281b operate as a T/R switch, which is biased using the driver chip 282. The first PIN diode switch 281a includes an anode electrically connected to the antenna pin ANT and a cathode electrically connected to the transmit pin TX. Additionally, the second PIN diode switch 281b includes an anode electrically connected to the antenna pin ANT and a cathode electrically connected to the receive pin RX. Additionally, a switch control signal is received on the switch control pin VCTRL, and is used to control a state of the first and second PIN diode switches 281a, 281b.

In the illustrated embodiment, the negative charge pump 285 generates a charge pump voltage $V_{CP}$ that is less than the ground voltage received on the ground pin GND. Additionally, the switching regulator 284 generates a regulated voltage $V_{SW}$ that is greater that supply voltage received on the power supply pin VCC. The selection logic circuit 286 of the driver chip 282 receives the switch control signal from the switch control pin VCTRL, and generates a transmit pin bias voltage $V_{TX}$ and a receive pin bias voltage $V_{RX}$ based on the switch control signal, the regulated voltage $V_{SW}$, and the charge pump voltage $V_{CP}$.

In certain configurations, the driver chip 282 generates the transmit pin bias voltage $V_{TX}$ using the charge pump voltage $V_{CP}$ when the switch control signal is in a first state, and generates the transmit pin bias voltage $V_{TX}$ using the regulated voltage $V_{SW}$ when the switch control signal is in a second state. Additionally, the driver chip 282 generates the receive pin bias voltage $V_{RX}$ using the regulated voltage $V_{SW}$ when the switch control signal is in the first state, and generates the receive pin bias voltage $V_{RX}$ using the charge pump voltage $V_{CP}$ when the switch control signal is in the second state.

Thus, the driver chip's switching regulator 284 and negative charge pump 285 generate voltage levels used for biasing the first and second PIN diode switches 281a, 281b based on the switch control signal received on the switch control pin VCTRL. In the illustrated embodiment, the transmit pin bias voltage $V_{TX}$ is filtered using the second bias voltage filter 292, and then provided to the cathode of the first PIN diode 281a using the second biasing inductor 295. Additionally, the receive pin bias voltage $V_{RX}$ is filtered using the third bias voltage filter 293, and then provided to the cathode of the second PIN diode 281b using the third biasing inductor 296. The power supply voltage received on the power supply pin VCC is filtered using the first bias voltage filter 291, and provided to the anodes of the first and second PIN didoes 281a, 281b using the first biasing inductor 294.

Accordingly, when the switch control signal is in a first state, the driver chip 282 can bias the first PIN diode 281a to electrically couple the antenna pin ANT to the transmit pin TX, and can bias the second PIN diode 281b to electrically decouple the antenna pin ANT from the receive pin RX. For example, the DC voltage across the first PIN diode 281a can be controlled to about $V_{CC}$-$V_{CP}$, and the DC voltage across the second PIN diode 281b can be controlled to about $V_{CC}$-$V_{SW}$. Additionally, when the switch control signal is in a second state, the driver chip 282 can bias the first PIN diode 281a to electrically decouple the antenna pin ANT from the transmit pin TX, and can bias the second PIN diode 281b to electrically couple the antenna pin ANT to the receive pin RX. For example, the DC voltage across the first PIN diode 281a can be controlled to about $V_{CC}$-$V_{SW}$, and the DC voltage across the second PIN diode 281b can be controlled to about $V_{CC}$-$V_{CP}$. Thus, a switching operation of the first and second PIN diode switches 281a, 281b can be controlled by the switch control signal received on the switch control pin VCTRL.

The illustrated driver chip 282 receives the programming signal from the program pin PRGRM. The program pin PRGRM is used to provide programmability to the driver chip 282. In one embodiment, the programming signal is used to control at least one of a voltage level of the charge pump voltage $V_{CP}$ or a voltage level of the regulated voltage $V_{SW}$.

Additional details of the packaged switch 280 can be as described earlier.

Figure 10A:
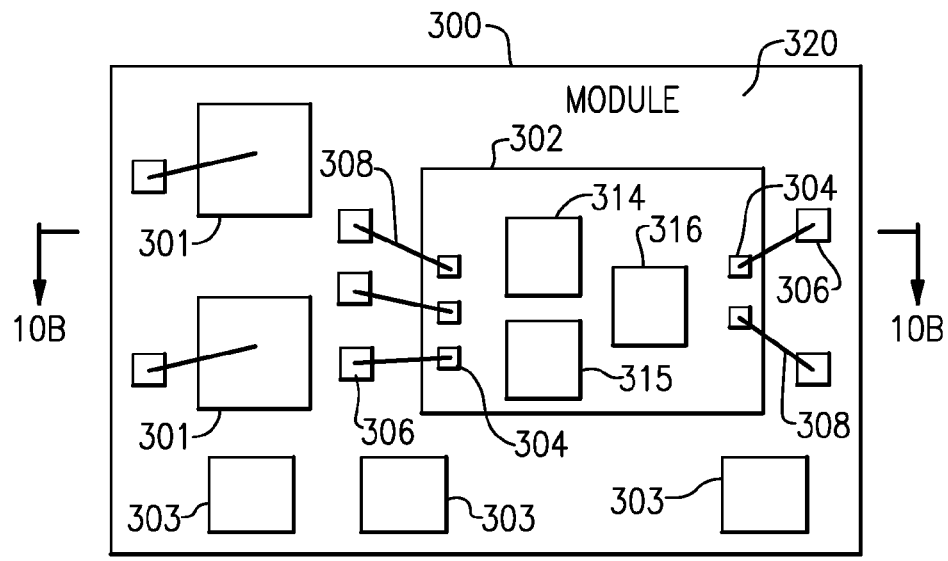
FIG. 10A is a schematic diagram of one embodiment of a packaged switch implemented in a packaged module.
Figure 10B:
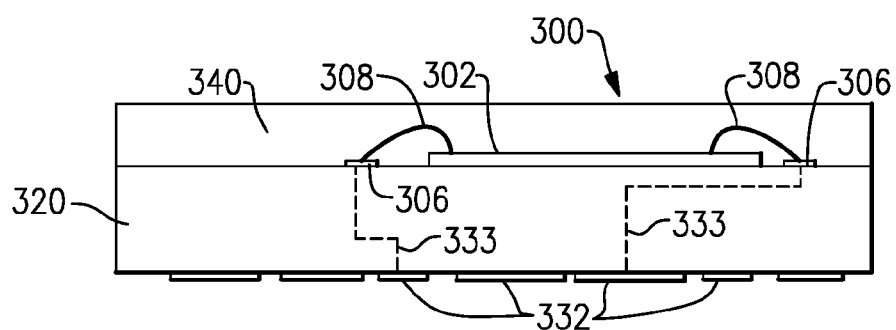
FIG. 10B is a schematic diagram of a cross-section of the packaged module of FIG. 10A taken along the lines 10B-10B.

FIG. 10A is a schematic diagram of one embodiment of a packaged switch implemented in a packaged module 300. FIG. 10B is a schematic diagram of a cross-section of the packaged module 300 of FIG. 10A taken along the lines 10B-10B.

The packaged module 300 includes PIN didoes 301, a driver chip or die 302, surface mount components 303, wirebonds 308, a packaging substrate 320, and encapsulation structure 340. The packaging substrate 320 includes pads 306 formed from conductors disposed therein. Additionally, the driver chip 302 includes pads 304, and the wirebonds 308 have been used to electrically connect the pads 304 of the driver chip 302 to the pads 306 of the packaging substrate 302.

As illustrated in FIGS. 10A and 10B, the driver chip 302 includes a switching regulator 314, a negative charge pump 315, and a selection logic circuit 316, which can be as described earlier.

The packaging substrate 320 can be configured to receive a plurality of components such as the PIN diodes 301, driver chip 302, and the surface mount components 303. The surface mount components 303 can include, for example, surface mount capacitors and/or inductors.

As shown in FIG. 10B, the packaged module 300 is shown to include a plurality of contact pads 332 disposed on the side of the packaged module 300 opposite the side used to mount the driver chip 302. Configuring the packaged module 300 in this manner can aid in connecting the packaged module 300 to a board such as a PCB of a base station. The example contact pads 332 can be configured to provide RF signals, control signals, power, and/or ground to the PIN diodes 301, driver chip 302, and/or the surface mount components 303. As shown in FIG. 10B, the electrical connections between the contact pads 332 and the driver chip 302 can be facilitated by connections 333 through the packaging substrate 320. The connections 333 can represent electrical paths formed through the packaging substrate 320, such as connections associated with vias and conductors of a multilayer laminated packaging substrate.

In some embodiments, the packaged module 300 can also include one or more packaging structures to, for example, provide protection and/or facilitate handling of the packaged module 300. Such a packaging structure can include overmold or encapsulation structure 340 formed over the packaging substrate 320 and the components and die(s) disposed thereon.

It will be understood that although the packaged module 300 is described in the context of electrical connections based on wirebonds, one or more features of the present disclosure can also be implemented in other packaging configurations, including, for example, flip-chip configurations.

Applications

Some of the embodiments described above have provided examples in connection with RF electronics such as base stations. However, the principles and advantages of the embodiments can be used for any other systems or apparatus that have needs for PIN diode switches.

Conclusion

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the word "connected", as generally used herein, refers to two or more elements that may be either directly connected, or connected by way of one or more intermediate elements. Furthermore, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A packaged switch comprising:
   a packaging substrate including a die paddle and a thermally conductive substrate attached to the die paddle;
   one or more PIN diode switches attached to the thermally conductive substrate; and
   a driver chip attached to the die paddle and configured to generate a plurality of bias voltages operable to control biasing of the one or more PIN diode switches, the driver chip including a switching regulator configured to generate a first bias voltage of the plurality of bias voltages and a charge pump configured to generate a second bias voltage of the plurality of bias voltages.

2. The packaged switch of claim 1 wherein the thermally conductive substrate is an aluminum nitride substrate.

3. The packaged switch of claim 1 further comprising an antenna pin and a transmit pin, the one or more PIN diode switches including a first PIN diode switch electrically connected between the antenna pin and the transmit pin.

4. The packaged switch of claim 3 further comprising a receive pin, the one or more PIN diode switches including a second PIN diode switch electrically connected between the antenna pin and the receive pin.

5. The packaged switch of claim 3 wherein the one or more PIN diode switches further includes a second PIN diode switch electrically connected in parallel with the first PIN diode switch.

6. The packaged switch of claim 1 further comprising a ground pin configured to control a voltage level of the die attach paddle.

7. The packaged switch of claim 1 further comprising a chip capacitor attached to the die paddle, the one or more PIN diode switches including a PIN diode switch having a cathode electrically coupled to the chip capacitor.

8. The packaged switch of claim 1 further comprising a supply voltage pin, the switching regulator configured to generate the first bias voltage from a supply voltage received on the supply voltage pin.

9. The packaged switch of claim 1 wherein the supply voltage pin is the only power supply pin of the packaged switch.

10. A radio frequency electronic system comprising:
a printed circuit board; and
a packaged switch attached to the printed circuit board, the packaged switch including a packaging substrate including a die paddle and a thermally conductive substrate attached to the die paddle, one or more PIN diode switches attached to the thermally conductive substrate, and a driver chip attached to the die paddle and configured to generate a plurality of bias voltages operable to control biasing of the one or more PIN diode switches, the driver chip including a switching regulator configured to generate a first bias voltage of the plurality of bias voltages and a charge pump configured to generate a second bias voltage of the plurality of bias voltages.

11. The radio frequency electronic system of claim 10 wherein the thermally conductive substrate is an aluminum nitride substrate.

12. The radio frequency electronic system of claim 10 wherein the packaged switch further includes an antenna pin and a transmit pin, the one or more PIN diode switches including a first PIN diode switch electrically connected between the antenna pin and the transmit pin.

13. The radio frequency electronic system of claim 12 wherein the packaged switch further includes a receive pin, the one or more PIN diode switches including a second PIN diode switch electrically connected between the antenna pin and the receive pin.

14. The radio frequency electronic system of claim 10 wherein the packaged switch further includes a chip capacitor attached to the die paddle, the one or more PIN diode switches including a PIN diode switch having a cathode electrically coupled to the chip capacitor.

15. A base station comprising:
an antenna;
a baseband processor; and
a packaged switch electrically connected in a signal path of the base station between the antenna and the baseband processor, the packaged switch including a packaging substrate including a die paddle and a thermally conductive substrate attached to the die paddle, one or more PIN diode switches attached to the thermally conductive substrate, and a driver chip attached to the die paddle and configured to generate a plurality of bias voltages operable to control biasing of the one or more PIN diode switches, the driver chip including a switching regulator configured to generate a first bias voltage of the plurality of bias voltages and a charge pump configured to generate a second bias voltage of the plurality of bias voltages.

16. The base station of claim 15 wherein the thermally conductive substrate is an aluminum nitride substrate.

17. The base station of claim 15 wherein the packaged switch further includes an antenna pin and a transmit pin, the one or more PIN diode switches including a first PIN diode switch electrically connected between the antenna pin and the transmit pin.

18. The base station of claim 17 wherein the packaged switch further includes a receive pin, the one or more PIN diode switches including a second PIN diode switch electrically connected between the antenna pin and the receive pin.

19. The base station of claim 15 further comprising a power amplifier, the one or more PIN diode switches including a PIN diode switch electrically connected between an output of the power amplifier and the antenna.

20. The base station of claim 15 wherein the packaged switch further includes a chip capacitor attached to the die paddle, the one or more PIN diode switches including a PIN diode switch having a cathode electrically coupled to the chip capacitor.

* * * * *